United States Patent [19]

Held et al.

[11] Patent Number: 5,250,387
[45] Date of Patent: Oct. 5, 1993

[54] TRANSFER PROCESS USING ULTRAVIOLET CURABLE, NON-PROLONGED TACK TONING MATERIALS

[75] Inventors: Robert P. Held, Englishtown, N.J.; Herman A. Yee, Sayre, Pa.

[73] Assignee: E. I. Du Pont de Nemours and Company, Wilmington, Del.

[21] Appl. No.: 827,258

[22] Filed: Jan. 29, 1992

[51] Int. Cl.$^5$ .................................................. G03C 5/00
[52] U.S. Cl. .................................. 430/253; 430/291; 430/328; 430/97
[58] Field of Search ............... 430/199, 254, 256, 257, 430/291, 302, 97, 328

[56] References Cited

U.S. PATENT DOCUMENTS

| | | | |
|---|---|---|---|
| 3,405,469 | 4/1970 | Titow | 117/21 |
| 3,649,268 | 3/1972 | Chu et al. | 430/291 |
| 3,723,114 | 3/1973 | Hagenbach | 96/1.4 |
| 3,997,344 | 12/1976 | Schlesinger et al. | 430/291 |
| 4,076,536 | 2/1978 | Schlesinger et al. | 430/291 |
| 4,461,823 | 7/1984 | Held | 430/120 |
| 4,469,625 | 9/1984 | Held | 252/514 |
| 4,579,802 | 4/1986 | Kishi | 430/99 |
| 4,599,293 | 7/1986 | Eckell et al. | 430/126 |
| 4,868,086 | 9/1989 | Ohvani et al. | 430/110 |
| 5,039,588 | 8/1991 | Held | 430/110 |

FOREIGN PATENT DOCUMENTS

| | | | |
|---|---|---|---|
| 57-144563 | 9/1982 | Japan . | |
| 2035591 | 6/1980 | United Kingdom | 430/291 |

OTHER PUBLICATIONS

RD-18007 "Image reproduction process using a photo-hardenable stratum", Apr. 1979.

Primary Examiner—Charles L. Bowers, Jr.
Assistant Examiner—Martin Angebranndt

[57] ABSTRACT

A process for transferring non-electroscopic, non-prolonged tack, UV curable toned images to an image receptor wherein said process produces images having substantially reduced back transfer is described.

21 Claims, No Drawings

TRANSFER PROCESS USING ULTRAVIOLET CURABLE, NON-PROLONGED TACK TONING MATERIALS

FIELD OF THE INVENTION

This invention relates to a transfer process using non-prolonged tack toning materials and, in particular, to a process using improved non-electroscopic, ultraviolet curable, non-prolonged tack toning materials for transferring toned images to image receptors wherein back transfer of the transferred image is substantially reduced.

BACKGROUND OF THE INVENTION

Prolonged tack toners prepared from thermoplastic resins and a plasticizer are well known in the art. Upon heating the thermoplastic resin and plasticizer mixture, the mixture becomes tacky or sticky and remains tacky for a considerable time even after cooling. This property is known as delayed tack or setting and has been found useful in the preparation of adhesive compositions, as well as in thermography, to produce a master which is imagewise exposed by means of heat to produce an image which is subsequently toned. The toned image is then transferred onto an image receptor to provide a copy of the original image. In this transfer process, the prolonged tack property is present in the form of a continuous film over an imagewise tacky element.

Prolonged tack toners are also used in the transfer process described above to make four color proofs. For example, in preparing a four color proof consisting of cyan, magenta, yellow, and black, a photosensitive element is imagewise exposed through a positive or negative transparency to produce a latent image having tacky toner-receptive areas and non-tacky background areas. The latent image is then toned with a cyan toner and the cyan toner image is transferred to a receptor. Another photosensitive element is exposed through an appropriate negative or positive transparency to produce a latent image which is subsequently toned with a magenta toner. The magenta toner image is then transferred to the same receptor, with the two images in register. Another latent image is produced in the same manner and toned with a yellow toner. The yellow image is then transferred to the same receptor to yield three images in register. A final latent image is produced and toned with a black toner. The black toner image is transferred to the receptor so that all four images are in register.

A problem associated with the use of prolonged tack toners in a transfer process to make four color proofs is that it is very difficult to transfer toned images to an image receptor without causing back transfer. For example, if the transferred toner image on the receptor remains tacky when the next color is transferred, the image on the receptor can back transfer to the surface of the photopolymer surface of the next color, resulting in partial image loss from the receptor to the photopolymer. Back transfer problems and the resulting image loss are unacceptable in the printing industry.

A prolonged tack toner that substantially reduces back transfer is described in assignee's copending application Ser. No. 07/661,751 filed Feb. 27, 1991. The prolonged tack toner is non-electroscopic and comprises an organic thermoplastic polymer; a solid plasticizer present in an amount of about 30 to 90% by weight based on the total toner weight; and a polymerizable, monomer mixture comprising a monomer and photoinitiator, the photoinitiator being present in an amount of 0.5 to 15% by weight based on the total toner weight. The toner contains a high concentration of solid plasticizer, and therefore, a longer post exposure time is required to achieve effective crosslinking and cure the image. Thus, a longer time is needed to detackify the image. Further, during manufacture these prolonged tack toners must be maintained at critical temperatures in order to achieve a proper dispersion of pigment and tack free mixture for subsequent grinding to obtain the required particle size distribution.

The non-prolonged tack, ultraviolet curable toning materials used in the process of the invention change their adhesive or "tackiness" property at a significantly faster rate than the above-described prolonged tack toner, thereby providing improved latitude when used in the process of the invention for the reduction of back transfer. In addition, a more durable image is produced thereby making it especially useful in a lithographic printing plate where increased wear is beneficial. Further, the process utilizes nonprolonged tack toning materials that are manufactured in a simpler manner than conventional prolonged tack toners.

SUMMARY OF THE INVENTION

This invention relates to a process for forming an image on a receptor comprising the steps of:

(a) providing a photosensitive element comprising a support and a photosensitive layer provided thereon;

(b) exposing imagewise said element to form a latent image having tacky toner-receptive areas and non-tacky background areas;

(c) applying to the latent image formed in step (b), a non-prolonged tack, ultraviolet curable toning material comprising a thermoplastic polymer and a monomer mixture, to produce a non-tacky toned image;

(d) bringing the element having the non-tacky toned image into intimate contact with a receptor at or above the melting point of the toning material, whereby the toned image becomes tacky, and, while the toned image is still tacky;

(e) separating the element and the receptor whereby the tacky toned image transfers imagewise to the receptor; and (f) post-exposing the transferred image on the receptor to actinic radiation to cure the image and make the transferred image non-tacky to back transfer.

In another embodiment of the invention a process is described for forming an image on a receptor wherein a latent image is toned with a non-prolonged tack, ultraviolet curable toning material comprising a copolymer selected from the group consisting of glycidyl methacrylate and glycidyl acrylate, said copolymer having a low tack point such that the toning material is tacky at the transfer temperature, and a photoinitiator is present in an amount of 0.5 to 15% by weight based on the total toner weight Following transfer of the tacky toned image to a receptor, the transferred image is then exposed to actinic radiation to produce a non-tacky toned image.

DETAILED DESCRIPTION OF THE INVENTION

The non-prolonged tack, ultraviolet curable toning materials used in the process of the invention may be in the form of a finely divided powder such as a toner. Alternatively, the toning material may be in the form of a precolored toning film.

The term "non-prolonged tack" as used herein means that the toning material is non-tacky at normal room temperatures, becomes tacky upon heating to an elevated temperature and reverts to its non-tacky state at a temperature below the temperature at which the toning material became tacky, including room temperature.

The term "non-electroscopic" as used herein means that the toning materials are neither repelled from nor attracted to a charged rod when placed in close proximity to the particles.

A latent tacky image has tacky toner-receptive areas and non-tacky background areas. The image is formed from a photosensitive element comprising a support and a photosensitive layer provided thereon. Such elements are capable of forming tacky and non-tacky images on their surface, upon exposure to actinic radiation, or by treatment with solutions, heat, or other means. Preferably the tacky images are formed in photosensitive layers which comprise positive-working or negative-working compositions. Suitable positive-working compositions are photohardenable, e.g., photopolymerizable compositions as disclosed in for example, Chu and Cohen, U.S. Pat. No. 3,649,268. Suitable negative-working compositions are disclosed in, for example, Abele and Grossa, U.S. Pat. No. 4,243,741; Cohen and Fan, U.S. Pat. No. 4,174,216; Dueber, U.S. Pat. No. 4,162,162; and Kempf, U.S. Pat. No. 4,859,551.

The terms "photopolymerizable" and "photohardenable" as used herein refer to systems in which the molecular weight of at least one component of the photosensitive layer is increased by exposure to actinic radiation sufficiently to result in a change in the rheological and thermal behavior of the exposed areas.

Surprisingly and unexpectedly it was found that back transfer can be substantially reduced by incorporating ultraviolet or "UV" curable crosslinkable monomers into a non-prolonged tack, ultraviolet curable toning material comprising an organic thermoplastic polymer, a photoinitiator and optionally a pigment. Alternatively, it was found that back transfer can be reduced using non-prolonged tack, ultraviolet curable toning materials which contain UV curable epoxy containing copolymers and a photoinitiator. These toning materials change their adhesive or "tackiness" property at a significantly faster rate than conventional prolonged tack toners, thereby providing improved latitude for the reduction of back transfer. In addition, the non-prolonged tack, UV curable toning materials do not contain a solid plasticizer, and therefore, the crosslinked image obtained is a more durable image.

The non-prolonged tack toning materials used in the process of the invention, are applied to a latent image and subsequently transferred to a receptor. The transferred toned image is then post-exposed to actinic radiation in order to cure the image. Following post-exposure, the image is hardened and tack is eliminated. It is believed that the use of toning materials having crosslinkable moieties such as an ethylenically unsaturated monomer or epoxy containing compounds, promote hardening of the image, thereby reducing back transfer.

The term "UV curing" as used herein means exposing a transferred toned image to actinic radiation to promote sufficient crosslinking. If a non-prolonged tack, actinic radiation curable toning material containing a UV curable crosslinkable monomer is used, crosslinking is sufficient when the monomer crosslinks upon exposure to actinic radiation. If a non-prolonged tack, actinic radiation curable toning material containing the epoxy containing copolymer is used, crosslinking occurs when the epoxy group crosslinks with other epoxy groups by acid catalyzed ring opening of the epoxy groups. The photoinitiator used with this system would have to generate an acid group upon exposure to actinic radiation such as the sulfonium salts used in Examples 8 and 18.

The non-prolonged tack, actinic radiation curable toning materials used in the process of this invention can be in the form of a dry particulate material or a precolored toning film. The precolored toning film comprises a support and a transfer layer provided thereon wherein said transfer layer comprises at least one finely divided powder and/or dissolved dye in a binder. They are made readily as described in Example 9. These precolored toning films facilitate high quality transfers of toned images to image receptors and exhibit reduced back transfer Thus, greater resolution is obtained.

A non-electroscopic, non-prolonged tack, actinic radiation curable toning material used in the process of the invention comprises an organic, thermoplastic polymer, and a polymerizable monomer mixture. Another non-electroscopic, non-prolonged tack toning material used in the process of the invention comprises an epoxy containing co-polymer, a photoinitiator, and optionally, a colorant. Toning materials of the first type can be prepared using any acrylate base polymer. However, the preferred polymer is an organic thermoplastic terpolymer consisting of substantially equal percentages by weight of styrene, alpha-methyl styrene and an acid selected from the group consisting of acrylic acid and methacrylic acid which can be made using conventional techniques such as solution polymerization. The preferred acid is acrylic acid. The terpolymer has an average molecular weight in the range from about 1,000 to about 100,000, preferably 1,500 to 10,000 and, most preferably, 2,000 to 8,000. The terpolymer is present in an amount from about 10% by weight to about 70% by weight based on total toner weight and, more preferably, about 20% to 50%. Polyamides are also useful as the thermoplastic polymer.

A monomer mixture is added to the terpolymer. The term "monomer mixture" as used herein refers to a mixture consisting of an addition-polymerizable ethylenically unsaturated monomer, and a photoinitiator or photoinitiator system. The preferred monomer is trimethylolpropane-trimethacrylate. However, other acrylic containing monomers can be used and are well known in the art. Examples of such monomers can be found in U.S. Pat. No. 4,323,636 issued to Chen, and Applicants' assignee's patent U.S. Pat. No. 4,894,315 issued to Feinberg et al.

The preferred photoinitiator is a free radical generating addition polymerization initiator activatable by actinic light and thermally inactive at and below 185° C. Photoinitiators of this type include the substituted or unsubstituted polynuclear quinones. Examples of these compounds are disclosed in Feinberg et al., U.S. Pat. No. 4,894,315. Benzophenone is an acceptable photoinitiator which can be used in practicing the invention. Anthracene bound sulfonium salts, with chain lengths of three to four atoms, are also useful initiators. These compounds are disclosed in M. G. Tilley, Ph.D. Thesis, North Dakota State University, Fargo, N.D. (1988)

[*Diss. Abstr. Int. B*, 49, 3791 (1989); *Chem. Abstr.*, 111, 39942u]. Sulfonium and iodonium initiators are also disclosed in UV Curing: Science and Technology, Vol.2, pp 13-22, Technical Marketing Corporation, Norwalk, Conn., 1985, S. P. Papas, Ed. Initiators are present in amounts from 0.5 to 15% by weight based on the total toner weight. Optionally, a photosensitizer such as coumarin compounds and thioxanthane dyes or dyes as disclosed in Dueber, U.S. Pat. No. 4,162,162 and Kempf, U.S. Pat. No. 4,859,551, can be added to extend the photosensitivity of the photoinitiator.

A colorant, such as a dye or pigment, may be added to the polymer. A number of dyes and pigments known to those skilled in the art can be used. Colorants suitable for practicing the invention include a dye or pigment such as carbon black. The colorant is present in an amount from 0% to 50% based on total toning material and, more preferably, from 0.5% to 20%.

It is believed that a UV curable, non-prolonged tack toning material of the type described above, reduces back transfer as a result of the monomer crosslinking upon exposing a toned transferred image to actinic radiation.

After applying the toning material to the image, the image is transferred to a receptor and post-exposed to actinic radiation to initiate the crosslinking reaction.

Accordingly, a process is provided for forming an image on a receptor comprising the steps of:

(a) providing a photosensitive element comprising a support and a photosensitive layer provided thereon;

(b) exposing imagewise said element to form a latent image having tacky toner-receptive areas and non-tacky background areas;

(c) applying to the latent image formed in step (b), a non-prolonged tack, ultraviolet curable toning material comprising a thermoplastic polymer and a monomer mixture, to produce a non-tacky toned image;

(d) bringing the element having the non-tacky toned image into intimate contact with a receptor at or above the melting point of the toning material, whereby the toned image becomes tacky, and, while the toned image is still tacky;

(e) separating the element and the receptor whereby the tacky toned image transfers imagewise to the receptor; and (f) post-exposing the transferred image on the receptor to actinic radiation to cure the image and make the transferred image non-tacky to back transfer.

Alternatively a non-electroscopic, non-prolonged tack toning material comprising an epoxy containing copolymer, a photoinitiator and optionally a colorant may be used in the process of the invention. The copolymer can be prepared from monomers selected from the group consisting of glycidyl methacrylate and glycidyl acrylate. The copolymer has an average molecular weight in the range of about 1000 to about 10,000. The copolymer is present in an amount of about 10 to about 50% by weight based on the total toner weight.

A photoinitiator and colorant of the kind discussed for preparing a toning material containing a UV curable crosslinkable monomer, can be added to the epoxy containing co-polymer.

Another process is described for forming an image on a receptor comprising the steps of:

(a) providing a photosensitive element comprising a support and a photosensitive layer provided thereon;

(b) exposing imagewise said element to form a latent image having tacky toner-receptive areas and non-tacky background areas;

(c) applying to the latent image formed in step (b), a non-prolonged tack, ultraviolet curable toning material comprising a copolymer selected from the group consisting of glycidyl methacrylate and glycidyl acrylate, said copolymer having a low tack point such that the toning material is tacky at the transfer temperature, and a photoinitiator is present in an amount of 0.5 to 15% by weight based on the total toner weight;

(d) bringing the element having the non-tacky toned image into intimate contact with a receptor at or above the melting point of the toner, whereby the toned image becomes tacky, and, while the toned image is still tacky;

(e) separating the element and the receptor whereby the tacky toned image transfers imagewise to the receptor; and (f) post-exposing the transferred image on the receptor to actinic radiation to cure the image and make the transferred image non-tacky to back transfer.

Actinic radiation from any source can be used to post-expose the transferred toned image. The radiation can emanate from point sources or be in the form of parallel rays or divergent beams. Inasmuch as the free-radical generating systems activatable by actinic radiation generally exhibit their maximum sensitivity in the ultraviolet range, the radiation source should furnish an effective amount of this radiation, preferably having a wavelength range between about 300 and 500 nm. Suitable sources of such radiation include carbon arcs, mercury-vapor arcs, Xenon® arc, fluorescent lamps with ultraviolet radiation-emitting phosphors, argon glow lamps, and photographic flood lamps. The preferred source of radiation is a mercury arc light source.

The toner particles have a size distribution within the range of about 0.2 to about 30 micrometers and not more than 50% of the toner particles are less than 1 micrometer particle size as described in U.S. Pat. No. 3,620,726 issued to Chu and Manger.

The non-prolonged tack toning materials used in the process of the present invention are used to tone an image formed upon exposing a photopolymerizable or photohardenable element to actinic radiation. Such elements comprise a photopolymerizable or photohardenable layer applied to a support. There can be mentioned as photopolymerizable or photohardenable compositions (1) those in which a photopolymerizable monomer is present alone or in combination with a compatible binder, or (2) those in which the photopolymerizable groups are attached to a polymer backbone which becomes activated to light and can then crosslink by reacting with a similar group or other reactive sites on adjacent polymer chains. In photopolymerizable systems of the latter type, where the monomer or pendant photopolymerizable group is capable of addition polymerization, e.g., a vinyl monomer, the photopolymerized chain length can involve the addition of many similar units initiated by a single photochemical event. Where only dimerization of similar compounds is involved, e.g., benzophenone or cinnamoyl compounds, the average molecular weight of the photosensitive constituent can be at best only doubled by a single photochemical act. Where a photopolymerizable molecule has more than one reactive site, a crosslinked network can be produced.

If either a simple monomer or monomer-polymer binder composition is used, the photopolymerizable or photohardenable layer preferably contains a free radical generating, addition polymerization initiator. Plasticizing agents, as well as other known additives, can be present in the photosensitive layer.

Free radical initiated, chain propagating, additional polymerizable layers which can be used to practice the invention are described in Burg and Cohen, U.S. Pat. No. 3,060,023; Celeste and Bauer, U.S. Pat. No. 3,261,686; and Cohen and Schoenthaler, U.S. Pat. No. 3,380,831. Polymers suitable for use in the monomer-polymer binder system and preferred free radical generating addition polymerization initiators are described in U.S. Pat. No. 3,060,023.

Photodimerizable materials useful in practicing the invention include cinnamic acid esters of high molecular weight polyols, polymers having chalcone and benzophenone type groups, and others disclosed in Chapter 4 of "Light-Sensitive Systems" by Jaromir Kosar, published by John Wiley & Sons, Inc., New York, 1965. Photopolymerizable materials capable of photocrosslinking with more than one adjacent polymeric chain to form a network are described in Schoenthaler, U.S. Pat. No. 3,418,295 and Celeste, U.S. Pat. No. 3,469,982.

Preferred free radical generating addition polymerization initiators, activatable by actinic radiation, e.g., ultraviolet and visible radiation, are described in U.S. Pat. No. 3,060,023.

Plasticizing agents which can be present in the photosensitive layer include dialkyl phthalate, polyoxyethylene(4)monolaurylether, polyethylene glycol, triethylene glycol diacetate, alkyl phosphates, etc.

A photosensitive layer, 0.0003 to 0.004 inch (0.0076 to 0.10 mm) thick, is present on a support such as a polymer film, plastic, metal or sheet such as paper whereon it adheres. The photosensitive composition can be laminated or coated on the support under conditions known to those skilled in the art. A known protective film, such as the one described in U.S. Pat. No. 3,060,026 issued to Heiart, can be present on the photosensitive layer. A protective film, such as polyethylene terephthalate, polyethylene, etc., can be present during imagewise exposure but is removed prior to application of the non-electroscopic, non-prolonged tack toning material to the tacky imaged surface.

The photopolymerizable layer is exposed to actinic radiation, generally through a process negative or positive transparency. The transparency is an image-bearing transparency consisting solely of substantially opaque and substantially transparent areas where the opaque areas have substantially the same optical density as the transparent areas.

Photosensitive compositions used in the process of this invention generally exhibit their maximum sensitivity in the ultraviolet range, and therefore, the radiation source should furnish an effective amount of this type of radiation having a wavelength range between 320–400 nm. For blue sensitive photopolymers, the wavelength range is between 400–500 nm, usually with appropriate filters to get the desired wavelengths. Suitable radiation sources include carbon arcs, mercury-vapor arcs, fluorescent lamps with special ultraviolet-emitting phosphors, argon glow lamps, electronic flash units and photographic flood lamps. The radiation exposure time can vary from fractions of a second to minutes, depending upon the intensity, type of radiation source used, its distance from the photopolymer element and nature and amount of photopolymer element. In general, exposure times range from 10 seconds to 10 minutes or more using standard commercial radiation sources.

Following imagewise exposure and removal of the cover sheet, the image is developed by applying a non-electroscopic, non-prolonged tack toning material of the type described above to the tacky image areas. The non-electroscopic, non-prolonged tack toning material may be in the form of a powder or a layer on a substrate such as a precolored toning film. The toning material adheres primarily in the tacky image areas. Any toner particles remaining in the non-tacky background areas can be removed by means known in the art, e.g., wiping, air devices, etc. The non-prolonged tack toning material is activated by heating it to at least a temperature wherein the toning material becomes tacky.

The activated tacky toned image-bearing substrate is then brought into intimate contact, under pressure, at a temperature above the melting point of the toning material, e.g., 90°–120° C, with an image receptor. Image receptors suitable for practicing the invention include paper, uncoated or coated paper such as Kromekote ®, film such as polyethylene terephthalate, or metals such as aluminum copper clad fiberglass, epoxy, or phenolic resin board.

Following separation of the element from the image receptor, the toning material loses some of its cohesiveness and a portion thereof transfers imagewise to the image receptor. At this point, the transferred toned image is tacky and after reducing the temperature of the non-prolonged tack toning material to below its activating temperature, the non-prolonged tack toning material reverts to its non-tacky state. The transferred toned image on the receptor is then post-exposed to actinic radiation which makes it non-tacky at the transfer temperature. The process can be repeated to receive each additional transferred image and thereby produce a multi-layered image with reduced back transfer. A higher density transferred image is obtained if the same toning material and the same color separation transparency are used. A multicolored image is obtained if a different toning material and different color separation transparency are used.

An image capable of accepting a non-prolonged tack toning material of the type described above, a method for applying the toning material thereon, a heating source to heat the transferred image, and a UV exposure source to crosslink the monomer in the transferred image are all that is needed to practice the process of the invention.

The automatic toning apparatus described in U.S. Pat. No. 4,069,791 issued to Tobias and the toning and transfer apparatus described in U.S. Pat. No. 4,461,823 issued to Held, can be used to practice the invention.

Non-prolonged tack toned images of the types described above can be used in single transfers to an image receptor. Multicolored images can be prepared on at least one image receptor by preparing a desired number of photosensitive elements, e.g., at least two and, preferably, four, exposing each element through a different color separation transparency and toning each imagewise tacky element with the appropriately colored non-prolonged tack toning material. Each toned image is then transferred in register to the same image receptor, then post-exposed to effect crosslinking. Thus, a four color proof exhibiting substantially reduced back transfer can be made using the non-prolonged tack toning material in the process of the instant invention.

Resist images can be formed using the process of the invention by transferring the toned image to copper clad laminates, e.g., phenolic resin or fiberglass epoxy boards, for example, and subsequently etching or plating the boards in the conventional manner.

The process of the invention can also be used to prepare lithographic printing plates by transferring the toned image to a lithographic surface, e.g., an aluminum plate, at a temperature above the melting point of the non-prolonged tack toner, e.g., 90°-120° C. The transferred image is then treated and inked to produce inked impressions of the image.

Heretofore, it has been quite difficult to transfer an image from an element to an image receptor without experiencing back transfer problems. As is shown in the examples below, the non-prolonged tack toning material used in the process described herein make it possible to transfer images to image receptors with substantially reduced back transfer.

The following examples illustrate the practice of the invention.

EXAMPLES

In the following examples, all percentages are by weight unless otherwise specified.

EXAMPLE 1

A cyan toner was prepared according to the following procedure:

20 grams of cyan Xerox® toner 6R192 (Xerox Corp., Rochester, N.Y.) was placed in an Osterizer® blender. While the blender was in operation, 4 grams of a sensitized monomer was added from a pipette, slowly, to uniformly disperse the liquid onto the powder. The sensitized monomer was made by mixing together:
- 100 grams trimethylolpropane trimethacrylate (TMPTMA)
- 4 grams benzophenone (BP)
- 2 grams Michler's Ketone (MK).

The Osterizer® was run for about one minute after the addition was complete with the powder suspended in air by the motion of the Osterizer® mixing blades. The Xerox® toner consists of a polymer having a melting point of about 65° to 70° C. and dispersed pigment.

A photopolymerizable element as described in Example 1 of U.S. Pat. No. 4,461,823 was placed in a vacuum frame with the cover sheet facing the glass cover of the vacuum frame. A transparency bearing a positive halftone image of the subject to be reproduced was then placed over the cover sheet, and the vacuum frame glass cover closed. A vacuum of about 25 inches of water (approx. 635 kg/m$^2$) was applied to assure intimate contact Of the transparency and the element. Using a 5 KW mercury vapor light source at a distance of 58 inches (147.3 cms), the photopolymerizable element was given a 35 second exposure. As a result of the exposure to actinic radiation, the unexposed areas of the photopolymerizable layer surface were imagewise tacky and the exposed areas were non-tacky.

The element was then removed from the vacuum frame and the cover sheet was peeled off. The exposed element was then toned by hand using an acrylic pad material attached to a plastic handle, whereby the cyan toner prepared as described above, was applied over the exposed photopolymerizable surface. Toner particles adhered to the tacky areas and the remaining toner was wiped off the element by a special cloth (Las-Stik®) manufactured by Las-Stik Mfg. Co., Hamilton, Ohio). The toned element was then subjected to heating to 194° F. (90° C.) for about one minute on a heating plate. The image was then transferred to a Kromekote® receptor manufactured by the Champion Paper Co., at transfer speed of 3.5 ft/min (0.5 cm/sec) in a modified Cromalin® laminator manufactured by Du Pont (E. I. du Pont de Nemours and Company, Wilmington, Del.), equipped with a metal heated roll at 90° C. and an unheated rubber covered roll. The transferred image on Kromekote® was tacky and was covered with a 2 mil polyester film base and post-exposed in a vacuum frame for 2 minutes to a 4 KW pulse xenon arc light source at a distance of 28 inches from the glass frame. Following post-exposure, which resulted in crosslinking, the image was no longer tacky to back transfer. The transferred toner image had good quality with a resolution of 2-97% dots in a 150 lines per inch target.

The density was uniform and measured at about 1.00 on a Macbeth reflection densitometer.

EXAMPLE 2

A magenta toner was prepared according to the procedure of Example 1 except that 30 grams of magenta Xerox® toner 6R198 and 4 grams of the sensitized monomer was used to prepare the toner. A photopolymerizable element, such as the one described in Example 1, was exposed according to the process described in Example 1 to produce a photopolymerizable layer surface having unexposed, tacky areas and exposed non-tacky areas. Following removal of the element from the vacuum frame and removal of the cover sheet, the exposed element was toned, with the magenta toner, as described in Example 1. The toned image was then transferred to a receptor. The transferred toner image was found to be non-tacky to back transfer after post exposure to actinic radiation. The transferred toner image had good quality with a resolution of 2-97% dots in a 150 lines per inch (lpi) target. The density was uniform and measured about 0.90 on a Macbeth reflection densitometer.

EXAMPLE 3

A black toner was prepared according to the procedure of Example 1 except that 20 grams of black Xerox® toner 6R189 and 4 grams of the sensitized monomer was used to prepare the black toner.

The toner was used to generate a black image which was then transferred to a receptor as describe in Example 1. The transferred image toner was found to be non-tacky to back transfer after post exposure to actinic radiation. The transferred toner image had good quality with a resolution of 2-97% dots in a 150 lpi target. The density was uniform and measured about 1.00 on a Macbeth reflection densitometer.

EXAMPLE 4

A yellow toner was prepared according to the procedure of Example 1 except that 20 grams of yellow Xerox® toner 6R194 and 4 grams of the sensitized monomer was used to prepare the toner.

The toner was used to generate a yellow image which was then transferred to a receptor as described in Example 1. The transferred toner image was found to be non-tacky to back transfer after post exposure to actinic radiation.

The transferred toner image had good quality with a resolution of 2-97% dots in a 150 lpi target. The density was uniform and measured about 0.80 on a Macbeth reflection densitometer.

EXAMPLE 5

The toners and transfer process described in Examples 1 through 4 were used to make a four color proof. First, the yellow image was produced on Kromekote ® paper as described in Example 1 using the toner of Example 4. Second, the magenta image was generated as described in Example 2 using the toner of Example 2, except that the transfer was made on top of the yellow image in register using standard pin registration for the exposure and transfer steps. Third, the cyan image was generated as described in Example 1 using the cyan toner of Example 1 and then transferred, in register, on top of the magenta image. Finally, the black image was generated using the black toner of Example 3 and transferred, in register, on top of the cyan image. After each transfer the transferred image was post exposed using a Xenon ® arc lamp. The image was sufficiently crosslinked after post exposure. Thus, there was no back transfer of the images from the paper to the next photopolymer surface. A high quality four color proof was generated.

EXAMPLE 6

Example 5 was repeated except that the photopolymer film contained the following formulation:

| Ingredient | % dry weight |
| --- | --- |
| Polymethylmethacrylate (Elvacite ®2051) | 19.3 |
| Polybutylmethacrylate (Elvacite ®2045) | 9.2 |
| Polyvinylacetate (Vinac ®B15) | 18.5 |
| Trimethylolpropane trimethacrylate | 27.4 |
| Ethoxylated trimethylolpropane triacrylate | 7.6 |
| Polyethylene glycol(4)lauryl ether (Brij ®30) | 7.6 |
| 2,2'-Bis(o-chlorophenyl)-4,4'-5,5'-tetraphenylbiimidazole | 2.4 |
| 2,2'-Bis(o-chlorophenyl)-4,4'-5,5'-tetrakis-(m-methoxyphenyl)-biimidazole | 2.4 |
| 2-Mercaptobenzoxazole | 2.4 |
| 2-(N-ethyl-1,2,3,4-tetrahydro-6-quinolylidene)-1-chromanone | 0.6 |
| 1-(2'-Nitro-4',5'-dimethoxy)phenyl-1-(4-t-butyl-phenyloxy)ethane | 2.8 |

The film was prepared as described in U.S. Pat. No. 4,461,823 at 90 mg/dm square coating weight on 7 mil subbed polyester film, and coated from methylene chloride solvent. A 0.5 mil polyester cover sheet was laminated to the photopolymer film.

The film was used to prepare a four color proof from negative color separations according to the following procedure: The film for each negative color separation was imagewise exposed to UV light using a Kokomo ® filter and a 5 KW mercury vapor light source at about 40 inch distance to the frame for about 40 seconds, to generate an inhibitor imagewise as described in Dueber, U.S. Pat. No. 4,162,162 and Kempf, U.S. Pat. No. 4,859,951. The film was then exposed a second time to blue light using the same light source but through a Lexan ® polycarbonate filter to filter out the UV light. The second exposure polymerized the monomers where inhibitor did not form in the first exposure.

There was no back transfer of the images from the receptor to the next photopolymer surface. A high quality four color proof was generated.

EXAMPLE 7

Example 3 was repeated except that the toner image was transferred to an aluminum plate suitable for the preparation of a lithographic printing plate having a silicate coated surface. The photopolymer toned element was brought into intimate contact with the aluminum plate under high pressure in a calendar nip formed by two rollers at 90° C. A uniform looking image was transferred onto the aluminum plate. A gum arabic scrubbing and cleanser solution was wiped on the transferred image. The transferred image was then used as a lithographic printing plate to produce 12,500 inked impressions.

EXAMPLE 8

A cyan toner was prepared according to the following procedure:

26.4 grams (6.6%) of Heliogen ® Blue K7090 (BASF Corp., Holland, Mich. 49423), 329 grams of an epoxy containing copolymer of glycidylmethacrylate/methylmethacrylate/n-butylmethacrylate in a weight ratio of 16/50/34%, giving a copolymer with a Tg of about 60° C., and an inherent viscosity of 0.07 (low molecular weight), 40 grams of triphenylsulfonium hexafluorophosphate (62% in propylene carbonate), 4.0 grams of 2-chlorothioxanthen-9-one, and 16 grams of benzophenone were placed in a 2 quart Bain Marie container (Le Beau Products, Baraboo, Wis. 53913). A 6 inch (15.24 cm) stainless steel chain was added and the mixture was shaken on a Paint Conditioner, Model MKI-R (Red Devil, Inc., Union, N.J. 07083) for 30 minutes.

The mixture was slowly added to a 2-roll rubber mill at 80°–90° C. so that a continuous molten band formed. The mill had 6 inch (15.24 cm) diameter rolls, 12 inches (30.48 cms) wide (William Thropp & Sons, Salem, Ohio 44460). The dispersion was then left on the rotating rolls for another 20 minutes. After removal from the rolls, it was cooled and broken up into 1–3 inch (2.54–7.62 cm) chips which were sufficiently small to be fed to a hammer mill.

The chips were fed to a Reitz mill to produce a coarse powder. The coarse powder was then fed to an 8 inch (20.32 cm) jet mill (Jet Pulverizer Co., Palmyra, N.J.) at 50 grams per minute. Particle size was obtained on a Coulter Counter Model TAII (Coulter Electronics, Inc., Hialeah, Fla. 33010) with a 30 micron aperture. The population average was 1.6 microns and the volume average was 13.0 microns.

The toner was used to make a transferred image as described in Example 1. The transferred image was found to be non-tacky to back transfer after exposure to actinic radiation.

The transferred toner image had good quality with a resolution of 2–97% dots in a 150 lpi target. The density was uniform and measured 1.30 on a Macbeth reflection densitometer.

EXAMPLE 9

A cyan pre-colored toning film was made according to the following procedure:

4.6 grams of polymethylmethacrylate (MW, weight average 7,800 and MW, number average 30,000) were dissolved in 94.1 grams of methyl ethyl ketone (MEK). 0.09 grams of benzophenone and 0.045 grams diethoxyacetophenone was added to this solution along with 10.0 grams of a pigment dispersion consisting of 2.0 grams of Heliogen ® Blue pigment and 1.0 grams of an AB type block polymeric dispersant such as butylmethacrylate/methacrylic acid (10//10) number average molecular weight 2482, in 7.0 grams of methyl ethyl ketone. A double slash indicates a separation between blocks and the values cited in parenthesis represent the degree of polymerization of each monomer.

The pre-colored toning film was made by coating with a draw down knife onto a 0.002 inch (0.00508 cm) thick Mylar® sheet to yield a dry thickness of 10 microns. The development film was used with the negative photopolymerizable element described in Example 6, to produce a pigmented image on a receptor. The procedure used to construct an image on a receptor consisted of (a) exposing the negative working photopolymerizable element as described in Example 6; (b) contacting the development film and the photopolymerizable element under pressure at room temperature so that the pre-colored layer was removed from the 0.002 inch (0.00508 cm) Mylar® support, resulting in the toning material adhering to the photopolymerizable element; and (c) imagewise transfer of the precolored layer to a receptor with heat and pressure as described in Example 1. The transferred image was then post exposed to actinic radiation as described in Example 1, to crosslink the image on the receptor. The transferred image was found to be non-tacky to back transfer.

The transferred image had good quality with a resolution of 2-97% dots in a 150 lpi target. The density was uniform at about 1.50 as measured on a Macbeth reflection densitometer.

A pre-colored toning film was prepared as in Example 9 except that 0.045 grams of Michler's Ketone (MK) was added in place of the 0.045 grams of diethoxyacetophenone. The process of development, image transfer to a receptor and image crosslinking on the receptor was as described in Example 9. The transferred image was found to be non-tacky to back transfer after exposure to actinic radiation.

The transferred image had good quality with a resolution of 2-97% dots in a 150 lpi target. The density was uniform and measured about 1.50 on a Macbeth reflection densitometer.

EXAMPLE 11

A pre-colored toning film was prepared as in Example 9 except that 2.26 grams of trimethylolpropane triacrylate were added in place of 2.26 grams of trimethylolpropane trimethacrylate. The process of toning film coating, development, image transfer to a receptor, and image crosslinking on the receptor was the same as described in Example 9. The transferred image was found to be non-tacky to back transfer after exposure to actinic radiation.

The transferred image had good quality with a resolution of 2-97% dots in a 150 lpi target.

The density was uniform at about 1.50 as measured on a Macbeth reflection densitometer.

EXAMPLE 12

A cyan pre-colored toning -film was made using the following procedure:

5.71 grams of a terpolymer of styrene/alphamethylstyrene/acrylic acid (33/33/34% by weight) was dissolved in 80.0 grams of MEK. To this solution was added 3.77 grams of trimethylolpropane trimethacrylate; 0.16 grams of benzophenone, 0.08 grams of MK; and 14.29 grams of a pigment dispersion, consisting of 2.86 grams of Heliogen® Blue K7090 pigment and 1.43 grams of a polymeric dispersant (described in Example 9 above) in 10.00 grams of MEK. The process of toning film coating, development, image transfer to a receptor, and image crosslinking on the receptor was as described in Example 9. The transferred image was found to be non-tacky to back transfer after exposure to actinic radiation.

The transferred image had good quality with a resolution of 2-97% dots in a 150 lpi target. The density was uniform and measured 1.3 on a Macbeth reflection densitometer.

EXAMPLE 13

A magenta pre-colored toning film was made as described in Example 12, except that Quindo® Magenta RV-6803 pigment (Mobay Chemical Co., Haledon, N.J. 07508) was used in place of the Heliogen® blue pigment.

The process of toning film coating, development, image transfer to a receptor, and image crosslinking on the receptor was as described in Example 9. The transferred image was found to be non-tacky to back transfer after exposure to actinic radiation.

The transferred image had good quality with a resolution of 2-97% dots in a 150 lpi target.

The density was uniform at and measured 1.30 as measured on a Macbeth densitometer.

EXAMPLE 14

A yellow pre-colored toning film was made as described in Example 12, except that Dalamar® yellow pigment (Heubach, Inc., Newark, N.J. 07083) was used in place of the Heliogen® blue pigment. The process of toning film coating, development, image transfer to a receptor and image crosslinking on the receptor was as described in Example 9. The transferred image was found to be non-tacky to back transfer after exposure to actinic radiation.

The transferred image had good quality with a resolution of 2-97% dots in a 150 lpi target. The density was uniform and measured 0.7 on a Macbeth reflection densitometer.

EXAMPLE 15

A black pre-colored toning film was prepared as described in Example 12, except that carbon black (Sterling® NS, Degussa Corp., Ridgefield Park, N.J. 07660) was used in place of the Heliogen® blue pigment. The process of toning film coating, development, image transfer to a receptor, and image crosslinking on the receptor was as described in Example 9. The transferred image was found to be non-tacky to back transfer after exposure to actinic radiation.

The transferred image had good quality with a resolution of 2-97% dots in a 150 lpi target. The density was uniform and measured 1.1 on a Macbeth reflection densitometer.

The pre-colored toning films, development process, image transfer process and image crosslinking process described in Examples 12, 13, 14, and 15 were used to make a four color proof. First the yellow image was produced as described in Example 14. Second, the magenta image was generated as described in Example 13, except that the image transfer was made on top of the yellow image in register using standard pin registration for the exposure and transfer steps. Third, the cyan image was produced as described in Example 12 and transferred in register on top of the magenta image.

Finally, the black image was transferred in register, on top of the cyan image using the pre-colored toning film and process of Example 15. After each transfer the transferred image was post exposed using a Xenon arc lamp. The image was sufficiently crosslinked after post exposure. There was no back transfer of the images from the paper to the next photopolymer surface. A high quality four color negative working proof was generated.

EXAMPLE 17

Example 16 was repeated except that the photopolymer film as described in Example 1 was used to generate the positive working images from a set of positive four color transparencies. There was no back transfer of the images from the paper to the next photopolymer surface. A high quality four color positive working proof was generated.

EXAMPLE 18

A cyan toning film was prepared according to the procedure of Example 9, except that the following formulation was used:

4.6 grams of a epoxy containing copolymer of glycidylmethacrylate/methylmethacrylate/n-butylmethacrylate in a weight ratio of 16/50/34% (as described in Example 8 above), 0.6 grams of triphenylsulfonium hexafluorophosphate (62% in propylene carbonate), 0.06 grams of 2-chlorothioxanthen-9-one and 0.2 grams of benzophenone were dissolved in 94.1 grams of MEK 10.0 grams of the pigment dispersion described in Example 9 were added to this solution.

The process of development, image transfer on the receptor, and crosslinking the image on the receptor were as described in Example 9. The transferred image was found to be non-tacky to back transfer after exposure to actinic radiation.

The transferred image had good quality with a resolution of 2–97% dots in a 150 lpi target. The density was uniform and measured 1.2 on a Macbeth reflection densitometer.

EXAMPLE 19

Example 15 was repeated except that the image was transferred to an aluminum plate suitable for the preparation of a lithographic printing plate having a silicate coated surface. The developed photopolymer element was brought into intimate contact with the aluminum plate under high pressure in a calendar nip formed by two rollers at 90° C. A uniform looking image was transferred onto the aluminum plate. A gum arabic scrubbing and cleanser solution was wiped on the transferred image. The transferred image was then used as a lithographic printing plate to produce 12,500 inked impressions.

What is claimed is:

1. A process for forming an image on a receptor comprising the steps of:
   (a) providing a photosensitive element comprising a support and a photosensitive layer provided thereon;
   (b) exposing imagewise said element to form a latent image having tacky toning material-receptive areas and non-tacky background areas;
   (c) applying to the latent image formed in step (b), a non-prolonged tack, ultraviolet curable toning material comprising a thermoplastic polymer and a monomer mixture, to produce a non-tacky toned image;
   (d) bringing the element having the non-tacky toned image into intimate contact with a receptor at or above the melting point of the polymer, whereby the toned image becomes tacky, and, while the toned image is still tacky;
   (e) separating the element and the receptor whereby a portion of the tacky toned image transfers imagewise to the receptor; and
   (f) post-exposing the transferred image on the receptor to actinic radiation to cure the image and make the transferred image non-tacky to back transfer.

2. A process for forming an image on a receptor comprising the steps of:
   (a) providing a photosensitive element comprising a support and a photosensitive layer provided thereon;
   (b) exposing imagewise said element to form a latent image having tacky toning material-receptive areas and non-tacky background areas;
   (c) applying to the latent image of the element a non-prolonged tack, ultraviolet curable comprising a copolymer selected from the group consisting of glycidyl methacrylate and glycidyl acrylate, said copolymer having a low tack point such that the material is tacky at the transfer temperature, and a photoinitiator present in an amount of 0.5 to 15% by weight based on the total toning material weight, to produce a non-tacky toned image;
   (d) bringing the element having the non-tacky toned image into intimate contact with the receptor at or above the melting point of the polymer, whereby the toned image becomes tacky, and while the toned image is still tacky;
   (e) separating the element and the receptor whereby a portion of the tacky toned image transfers imagewise to the receptor; and
   (f) post-exposing the transferred image on the receptor to actinic radiation to cure the image and make the transferred image non-tacky to back transfer.

3. The process according to claim 1 or 2 wherein the non-prolonged tack, ultraviolet curable toning material is in the form of a dry particulate material.

4. The process according to claim 1 or 2 wherein the non-prolonged tack, ultraviolet curable toning material is in the form of a precolored toning film.

5. The process according to claim 1 wherein the thermoplastic polymer is a terpolymer consisting of substantially equal percentages by weight of styrene, alpha-methyl styrene and an acid selected from the group consisting of acrylic acid, and methacrylic acid, said terpolymer having an average molecular weight in the range of 1000 to 100,000 and being present in the range of 10 to 70% by weight based on total toning material weight.

6. The process according to claim 1 wherein the monomer mixture consists of an addition-polymerizable ethylenically unsaturated monomer and a photoinitiator or photoinitiator system.

7. The process according to claim 6 wherein the addition-polymerizable ethylenically unsaturated monomer is an acrylic containing monomer.

8. The process according to claim 7 wherein the acrylic containing monomer is trimethylolpropanetrimethacrylate.

9. The process according to claim 5 wherein the acid is acrylic acid.

10. The process according to claim 1 or 2 wherein a colorant is present in an amount ranging from 0.5% to 50% based on total toning material weight.

11. The process according to claim 5 wherein the terpolymer is present in an amount of 20% to 50% of the total toning material weight.

12. The process according to claim 5 wherein the terpolymer has a molecular weight in the range of 1500 to 10,000.

13. The process according to claim 12 wherein the terpolymer has a molecular weight in the range of 2000 to 8000.

14. The process according to claim 1 or 2 wherein the toned image is transferred at a temperature above the melting point of the toning material.

15. The process according to claim 14 wherein the toned image is transferred at a temperature in the range from 90°–120° C.

16. The process according to claim 1 or 2 wherein the image receptor is paper or coated paper.

17. The process according to claim 1 or 2 wherein the image receptor is an aluminum plate and after image transfer the image is heated at a temperature up to about 150° C., treated with lithographic solutions and used as a lithographic printing plate.

18. The process according to claim 17 wherein the toned image is transferred at a temperature in the range from 90°–120° C.

19. The process according to claim 1 or 2 wherein steps (a) to (f) are repeated at least two times.

20. The process according to claim 19 wherein the same color separation transparency and the same toning material are used when steps (a) to (f) are repeated.

21. The process according to claim 19 wherein a different color separation transparency and a different toning material are used when steps (a) to (f) are repeated.

* * * * *